United States Patent [19]

McFadyen et al.

[11] 4,050,022

[45] Sept. 20, 1977

[54] AM-FM RECEIVER HAVING IMPROVED MODE CONVERSION

[75] Inventors: Robert J. McFadyen, Syracuse; William Peil, N. Syracuse, both of N.Y.

[73] Assignee: General Electric Company, Syracuse, N.Y.

[21] Appl. No.: 731,281

[22] Filed: Oct. 12, 1976

Related U.S. Application Data

[63] Continuation of Ser. No. 623,653, Oct. 20, 1975.

[51] Int. Cl.$^2$ .............................................. H04B 1/06
[52] U.S. Cl. ................................... 325/315; 325/316; 325/317; 325/319; 330/22; 330/28
[58] Field of Search ............................... 325/315–319; 330/19, 20, 22, 28

[56] References Cited

U.S. PATENT DOCUMENTS

| | | | |
|---|---|---|---|
| 3,665,507 | 5/1972 | Peil | 325/315 |
| 3,898,576 | 8/1975 | Fukaya | 330/19 |
| 3,922,615 | 11/1975 | Sobajima | 330/22 |
| 3,936,750 | 2/1976 | Peil et al. | 325/315 |
| 3,999,138 | 12/1976 | Peil | 325/317 |

*Primary Examiner*—Robert L. Griffin
*Assistant Examiner*—Michael A. Masinick

*Attorney, Agent, or Firm*—Richard V. Lang; Carl W. Baker; Frank R. Neuhauser

[57] ABSTRACT

The present invention relates to an AM-FM receiver suitable for integrated circuit fabrication and having improved mode conversion means. The AM-FM receiver had a d.c. coupled IF broadband IF amplifier comprising a plurality of stages of emitter coupled transistor pairs. A d.c. feedback network is provided to balance the individual stages and to generate a control potential for further use in mode conversion. In the FM mode, the IF amplifier operates with a high, stable gain at the FM IF frequency with gain reduction for noise suppression purposes below the FM IF frequency. Frequency dependent noise suppression is provided by a capacitance associated with the degenerative network. In the AM mode, the IF amplifier operates at a controllable, medium gain with the degenerative effect on IF gain restored at the AM IF frequency by the addition of capacity to the degenerative network. A control bus, energized by the degenerative network, is used for gain control purposes in the AM tuner and for mode conversion in the AM tuner, the AM-FM detector, and separate portions of the AM and FM audio circuitry.

20 Claims, 5 Drawing Figures

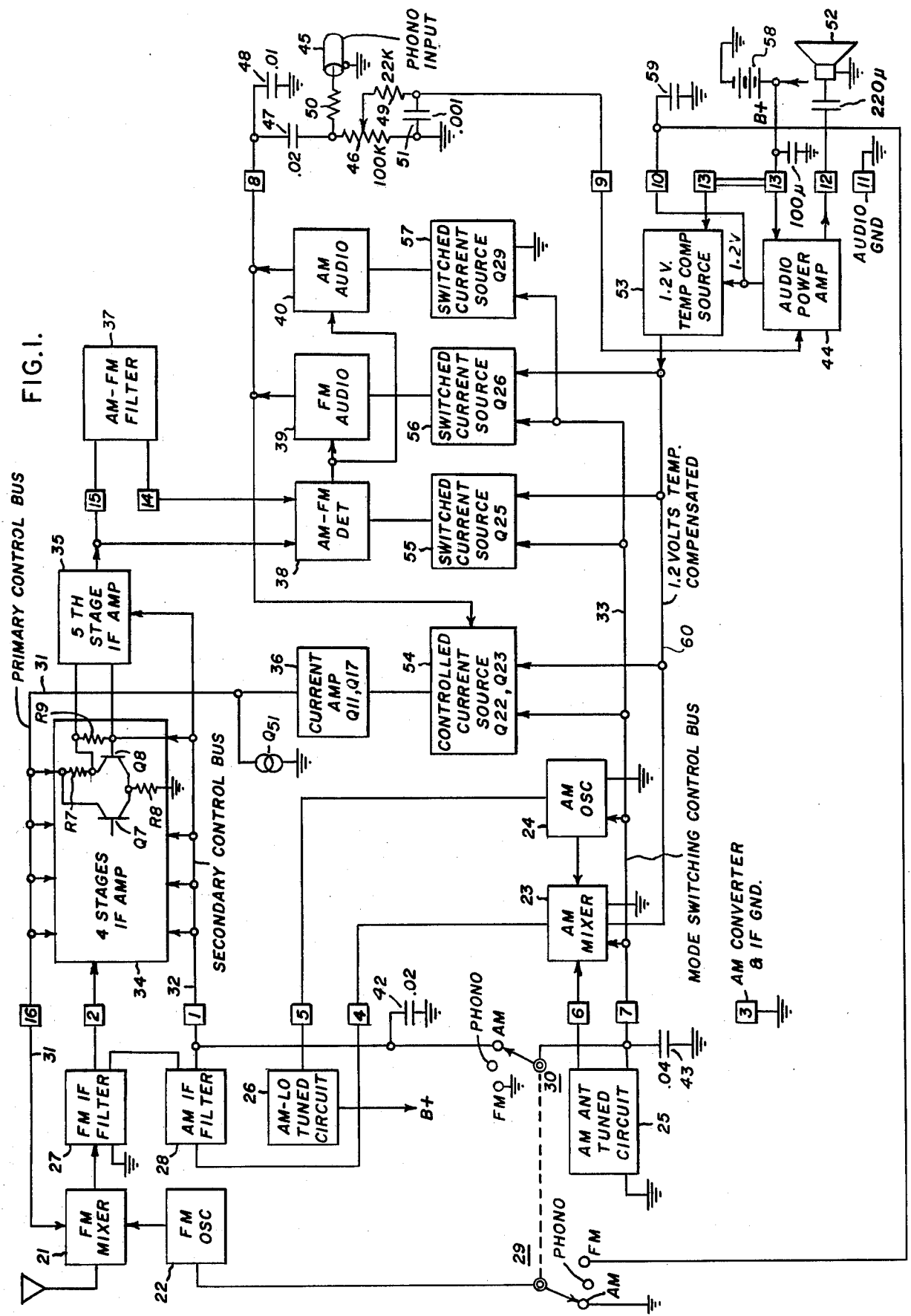

$K_{AM}$ AND $K_{FM} \gg 1$

AM-FM RECEIVER HAVING IMPROVED MODE CONVERSION

This application is a continuation of application Ser. No. 623,653, filed Oct. 20, 1975.

A radio receiver utilizing some of the same circuit elements and a selected organization of the mode conversion measures is described in U.S. application Ser. No. 542,623 now U.S. Pat. No. 3,936,750, entitled "AM-FM Receiver Having Improved Bias Supply Circuit. " An AM-FM detector similar to that herein described is the subject of application Ser. No. 565,717 now U.S. Pat. No. 3,999,138, entitled "Detector for AM-FM Signals".

BACKGROUND OF THE INVENTION

1. Field of the Invention

The present invention relates to AM-FM receivers adapted for integrated circuit fabrication and having improved mode conversion means.

The invention treats the means for converting the radio receiver from AM to FM and optionally to phono operation while at the same time optimizing the individual circuits for each mode of operation. Optimization is achieved in noise filtering, particularly in the FM mode, automatic gain control in AM, automatic frequency control in FM and temperature compensation in FM.

2. Description of the Prior Art

Radio receivers for AM and FM operation have been proposed fabricated primarily of integrated circuitry. In integrated circuit fabrication, increased circuit complexity produces little increase in costs, thereby permitting highly sophisticated circuitry even in low cost applications. Because of the cost advantage in integration, it is desirable to integrate a maximum amount of the circuitry with a minimum of non-integrated or "outboarded" components. Cost considerations also dictate a minimum pin count. In carrying out radio receiver functions, optimization of each function for either the AM or FM mode is desirable and the conversion between modes should be readily achieved. For instance, it is essential to provide an IF amplifier which is of a high and stable gain for FM operation, while for AM operation less gain is required and the gain should be readily controlled. Similarly, the detection function should be separately optimized for the AM and for the FM detection modes and for easy conversion between these two modes. A suitable IF amplifier is a d.c. coupled broad band amplifier incorporating a plurality of emitter coupled transistor stages and utilizing degenerative feedback for balance. Such an amplifier is disclosed in the first cited U.S. application. A suitable AM-FM detector is described in the second cited patent application. A known technique for enabling and disabling functional circuits of this nature is through the use of controlled transistor current sources which are in turn responsive to the setting of a manual switch.

SUMMARY OF THE INVENTION

Accordingly, it is an object of the present invention to provide an improved AM-FM receiver suitable for integrated circuit fabrication.

It is a further object of the present invention to provide an AM-FM receiver having improved mode conversion means.

It is an additional object of the present invention to provide an AM-FM receiver having a broadband d.c. coupled IF amplifier optimized for use in both AM and FM modes and having improved noise characteristics.

It is still another object of the present invention to provide an AM-FM receiver having improved means for achieving mode conversion and automatic gain control action.

It is another object of the invention to provide an AM-FM receiver having improved means for effecting mode conversion, automatic gain control on AM and automatic frequency control on FM.

It is a further object of the present invention to provide an AM-FM receiver with a phono input provision having improved mode conversion means.

It is an additional object of the present invention to provide an improved AM-FM receiver whose tuning and essential operating points on FM are temperature compensated.

These and other objects of the invention are achieved in a radio receiver having AM and FM modes of operation. The inventive combination comprises a d.c. coupled IF amplifier for signals at two intermediate frequencies, subject to amplification control by bias voltage variation. The IF amplifier includes a plurality of stages each having wide band a.c. gain and including an emitter coupled transistor pair. A primary control bus is provided for applying a d.c. collector bias potential to the individual IF amplifier transistors, with the potential being subject to variation in accordance with the mode setting of the radio receiver and/or a signal parameter such as signal strength on AM or frequency offset on FM. A secondary control bus is also provided for controlling the input bias level of the individual IF amplifier transistors and for applying degenerative d.c. feedback to balance each transistor pair. The secondary control bus is established at a potential which is a function of the potential of the primary control bus and degenerative d.c. feedback is applied thereto. The means for energizing the secondary control bus includes a collector load resistance connected between said primary control bus and the collector of the final transistor of one IF amplifier stage, and a degenerative feedback resistance having one end connected to the collector and the other end to the base of the final transistor and to the secondary control bus. The degenerative network also includes capacitance means for by-passing the secondary control bus to ground. The capacitance has a first value in the FM mode, selected in respect to the feedback resistance and the FM gain of the IF amplifier to preclude degenerative feedback at the higher FM IF frequency and provide a decreased gain and attenuation of noise below the higher FM IF frequency, and a second value in the AM mode selected in respect to said feedback resistance and the AM gain of said IF amplifier to preclude degenerative feedback at the lower AM IF frequency.

Typically, the capacitance means comprises a first capacitor having the first value, and a second capacitor switched into parallel with the first capacitor in the AM mode to provide the second value.

In accordance with a further aspect of the invention, mode switching means are provided for converting the IF amplifier to AM or FM operation comprising a first switch having a first stationary contact coupled to the secondary control bus, a second stationary contact coupled to ground, and a movable contactor selectively contacting the stationary contacts for mode selection. A third control bus is coupled to the movable contactor and assumes ground potential for FM operation and the potential of the secondary control bus for AM operation to provide a variation in bus potential sufficient to render transistors whose input junctions are coupled to it conductive or non-conductive.

The inventive combination additionally includes a tuner for converting the received AM and FM signals to the two predetermined intermediate frequencies. The tuner comprises an FM portion connected to the primary control bus and includes a local oscillator, tunable by bias voltage adjustment and energized through the connection, and an AM portion coupled to the third control bus for automatic gain control. The mode switching means is connected to the tuner for conversion to AM or FM operation.

In accordance with a more specific aspect of the invention, the AM portion of the tuner includes a four quadrant multiplier mixer comprising two pairs of differentially connected transistors in an upper rank and a single pair of differentially connected transistors in a lower rank. The AM signal is injected into the lower rank. The AM portion also includes an AM oscillator having a transistor current source for amplitude control, the output of the oscillator being injected into the upper rank. The input junctions of the lower rank mixer transistors and the oscillator current source are coupled to the third control bus for turning on the AM tuner and for automatic gain control in the AM position of the first switch and for turning off the AM tuner in the FM position of the first switch.

The FM portion of the tuner includes a transistor local oscillator. Mode switching of the FM local oscillator is provided by the provision of a second switch ganged with the first switch and having a first stationary contact connected to ground for the AM mode, a second stationary contact coupled to a source of positive d.c. potentials for the FM mode, a movable contactor selectively connecting the stationary switch contacts to the input junction of said FM oscillator transistor so as to turn it on for the FM setting and to turn if off for the AM setting.

As additional elements of the combination, an AM-FM detector and bias supply means are provided. The AM-FM detector produces a d.c. voltage for automatic frequency control proportional to the frequency offset when an FM signal is detected and produces a d.c. voltage for automatic gain control proportional to the signal amplitude when an AM signal is detected. The bias supply means comprises a current amplifier for deriving energy from a primary source of d.c. bias potentials and energizes the primary control bus. The current amplifier controls the potential of the primary control bus in response to the potential on the third control bus (making the bus potential dependent on the mode selection) and in response to the detector output. Typically, the primary control bus is set at a higher d.c. potential for FM operation, increasing the gain of the IF amplifier and making the gain less sensitive to potential variation on the primary control bus. In the AM setting, the primary control bus is set at a lower d.c. potential for AM operation making the gain of the IF amplifier more sensitive to potential variation on the bus.

Further aspects of the invention include temperature compensation of the IF gain and of the FM oscillator frequency; improved automatic gain control involving delayed action in the AM tuner and more positive mode selection. A "phono" mode of operation is also provided for the AM and FM portions of the receiver quiescent.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings, in which:

FIG. 1 is a simplified drawing primarily in block diagram form, of an AM-FM receiver embodying the invention.

FIGS. 2A and 2B are an essentially complete circuit diagram of the embodiment, omitting primarily the audio power amplifier.

DESCRIPTION OF A PREFERRED EMBODIMENT

Figure 2A:
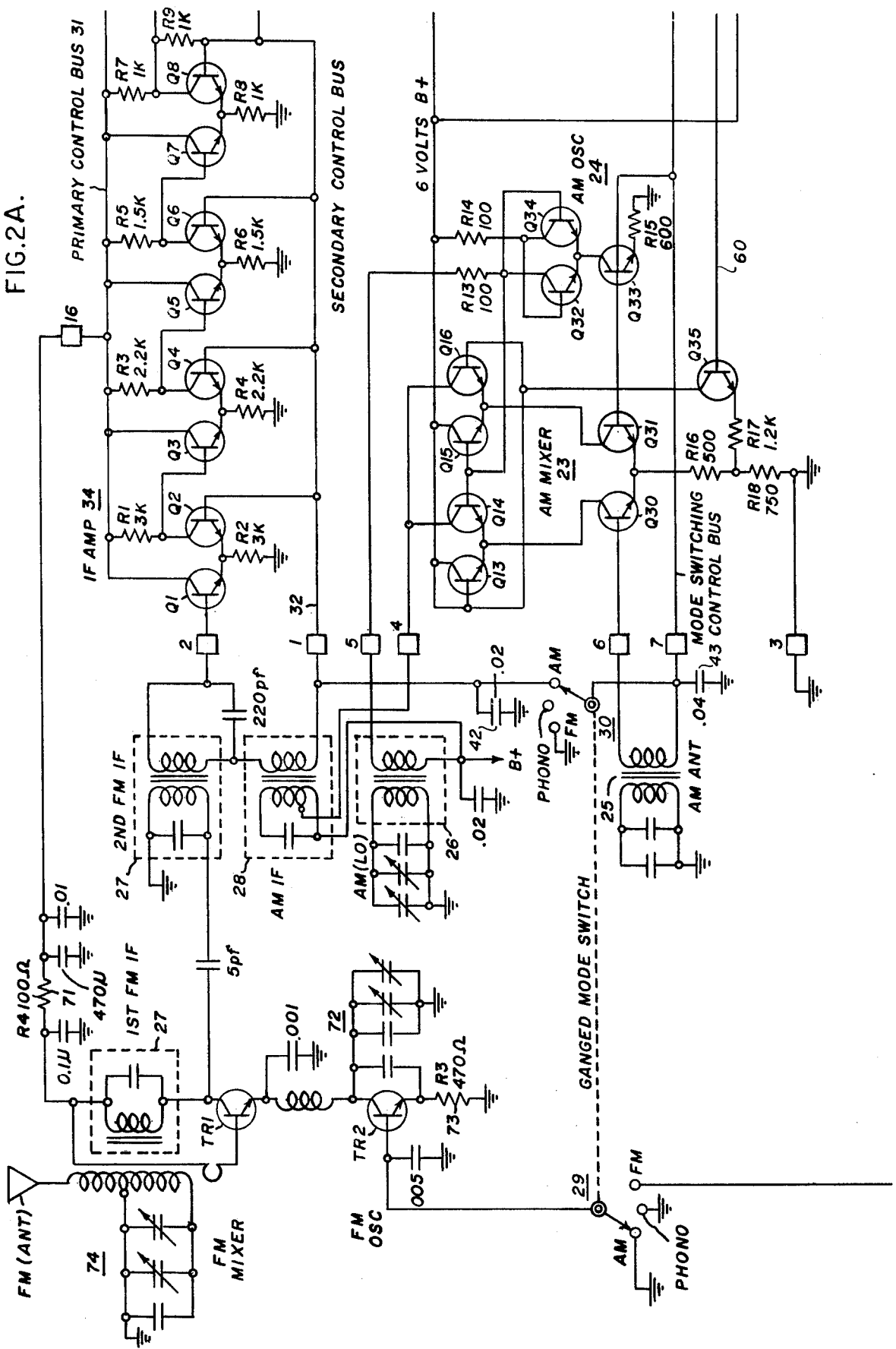
FIGS. 2A and 2B are separated parts of a diagram of the embodiment illustrated in FIG. 1.

A radio receiver embodying the invention is shown in simplified block diagram form in FIG. 1. The radio receiver takes the general form of a super-heterodyne receiver and is intended for AM, FM and phono operation. Of particular interest are those features directed to low radio frequency noise filtering, conversion of the receiver between the three individual modes of operation, and improved AGC action.

The radio receiver of the invention is designed for integrated circuit fabrication. In both FIGS. 1 and 2, the line of separation between the outboarded components and those on the integrated circuit are established by the "pads" to which external electrical connections are made.

Signal conversion to a pair of fixed intermediate frequencies is achieved in the blocks 21 to 30 comprising the "front end" or tuner of the receiver. The FM portion of the tuner is not on the integrated circuit. It includes an FM transistor mixer 21 shown with an input connection to a source of FM signals, typically a whip antenna. An FM transistor local oscillator 22 is provided whose output is coupled to the FM mixer to produce signals at a first higher intermediate frequency, typically 10.7 megahertz. The FM IF signal is filtered in the FM IF filter 27 before application through pad 2 to the IF amplifier (34, 35) on the integrated circuit. For mode conversion, and in particular for enabling and disabling the FM portion of the front end, a selector switch 29 is provided whose movable contactor is coupled to the input junction of the transistor of the FM oscillator 22. In the AM position, the movable contactor contacts a first stationary contact, which is grounded and which disables the FM oscillator. In the FM position, the contactor couples the oscillator input junction to a second stationary contact connected to a source of positive d.c. potentials (+1.2 volts) selected to forward bias the input junction of the FM oscillator transistor. In the phono position, the movable contactor is isolated from either stationary contact, which as will be explained, also leaves the FM portion of the tuner in a quiescent state.

For AFC action, the FM mixer is coupled through pad 16 to a bus 31 on the integrated circuit denominated the primary control bus. As will be described, the voltage on bus 31 varies with the output of the AM-FM detector. In the FM mode, this output is applied to the FM local oscillator to adjust its frequency in a sense to reduce drift.

The AM portion of the tuner includes an AM antenna tuned circuit 26 having a ferrite element for remote reception of AM signals, an AM mixer 23 includes integrated active transistor circuitry, an AM local oscillator tuned circuit 26, an AM oscillator 24, including integrated active transistor circuitry, an AM IF filter 28 and a second selector switch 30 ganged with switch 29 for mode conversion. The output of the AM oscillator 24 is coupled on the integrated circuit to the AM mixer, and the heterodyned output at the lower intermediate frequency of 455 kilohertz appears at the mixer output (pad 4) where it is filtered by the AM IF filter 28 prior to re-introduction at pad 2 to the integrated circuit through the series connected FM IF filter 27.

Mode conversion of the tuner for the AM portion is controlled by the second switch 30. The second switch has a movable contactor operable into contact with a first stationary contact, which is grounded, and used when the radio receiver is in the FM mode of operation. The movable contactor may also contact a second stationary contact for the AM mode of operation. The second stationary contact is returned to pad 1 on the chip. Pad 1 is coupled to a bus 32 on the integrated circuit denominated the secondary control bus, which has a small varying positive d.c. potential (0.8 to 1.2 volts) for the AM mode. As will be described, the voltage on bus 32 varies with detector output to perform an automatic gain control function. The movable contactor of switch 30 is connected to pad 7 which is in turn coupled to the third or mode switching control bus 33. The AM mixer 23 and AM oscillator 24 are returned to bus 33 for mode switching and AGC action. When the switch 30 is in the FM position (with the third control bus grounded), the input junctions of the transistors controlling AM mixer and AM oscillator currents are biased off, precluding operation. In the AM position, the small, signal dependent, positive potentials on the third control bus turn on the input junctions controlling the mixer and AM oscillator and provide automatic gain control action of the AM portion of the tuner. (As will be developed, the control bus 33 is of general use mode conversion of several other portions of the radio receiver.)

The integrated IF amplifier 34, 35 is a broad band, d.c. coupled amplifier designed to amplify signals from the AM-FM tuner at either the 455 kilohertz or 10.7 megahertz IF frequency to a level suitable for detection. Essential selectivity for suppressing interchannel interference is provided by the AM and FM input (27, 28) and output (40) filters. The IF amplifier 34, 35 includes five d.c. coupled transistor stages having a potential a.c. gain of approximately 15 db per stage at optimum d.c. bias. The first four stages (34) have approximately unity d.c. gain produced by a degenerative feedback network. Neglecting the input and output filters, and roll off attributable to capacitance in the degenerative feedback network, the IF amplifier amplifies from audio frequencies to an upper frequency limit in excess of 10.7 megahertz.

The IF amplifier 34, 35 is convertible between an AM and FM mode of operation and participates in effecting mode conversion of other portions of the radio receiver. Mode conversion of the IF amplifier is achieved in response to a change in the d.c. potential on the primary control bus 31. The d.c. potential on bus 31 is in turn controlled by the current amplifier 36 in response to the mode setting and signal level. The primary control bus 31 supplies collector bias to the transistors making up the first four stages (34) of the IF amplifier, while the fifth stage (33) is provided with separate collector bias. In the FM mode of operation, the collector bias on the bus 31 is established at a relatively high value, typically 2.5 volts. This voltage produces optimum signal gain and reduces the sensitivity of the IF gain to small variations in bus potential. With the usual FM signal, the IF gain is normally adequate to produce signal limiting. For AM operation, the collector bias on bus 31 is established at a much lower value, typically 1.5 volts. This lower voltage produces several db less gain per stage and makes the gain of the IF amplifier more sensitive to variations in potential on the primary control bus. In the AM mode setting, the gain control range of the IF amplifier is about 30 to 40 decibels.

Figure 2B:
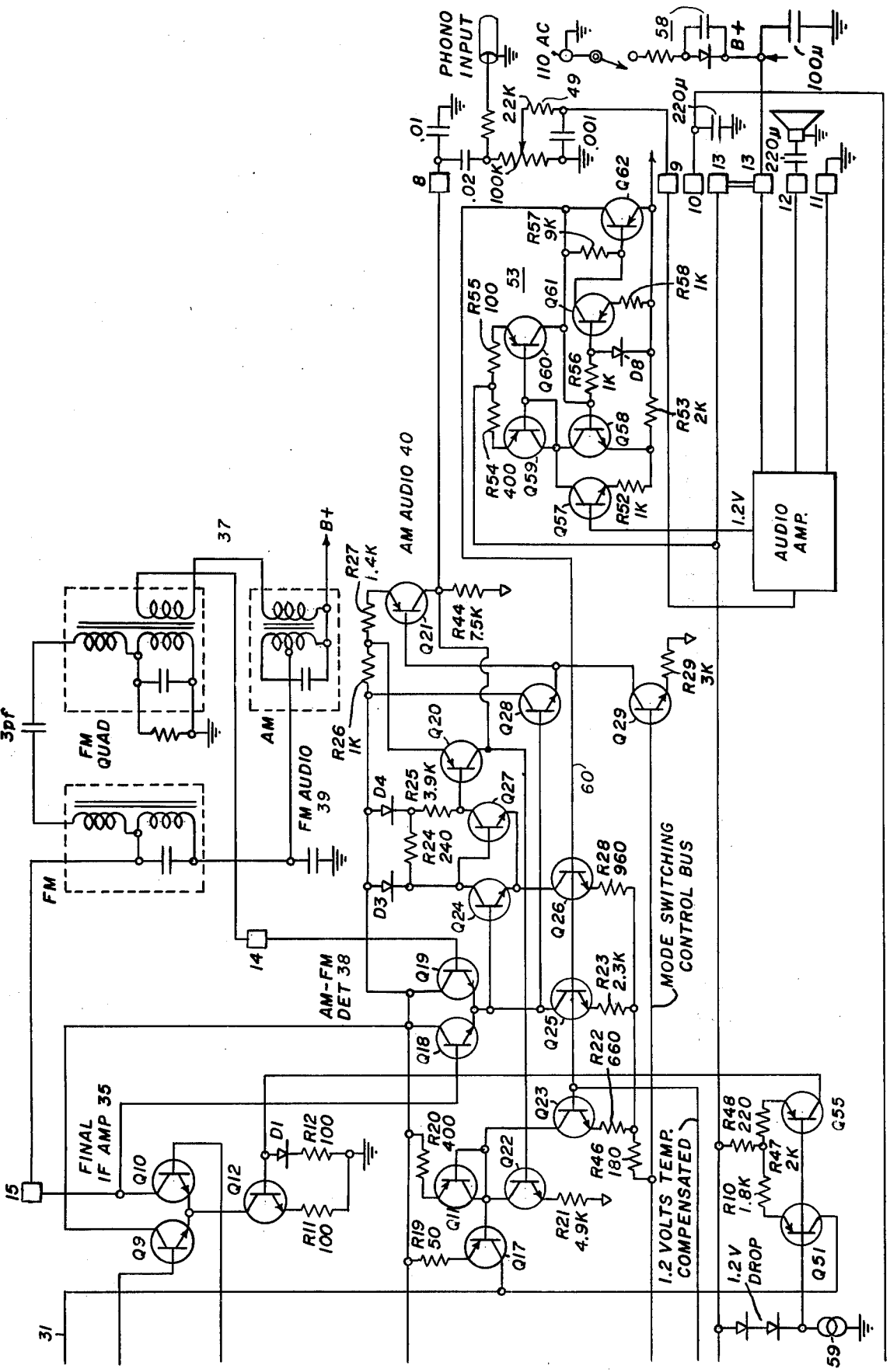
Figure 3:
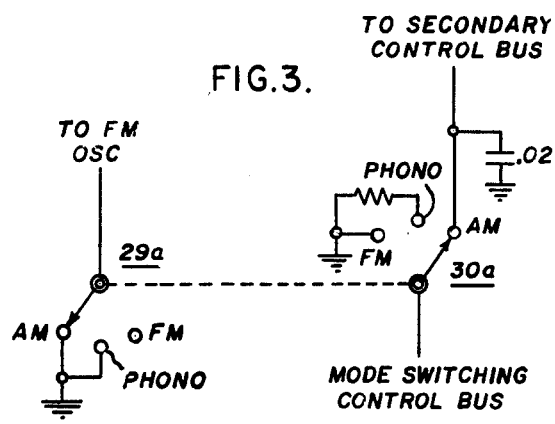
FIG. 3 is a diagram of a modified switch for mode conversion of the receiver between AM, FM and phono modes of operation.

The IF amplifier 34 participates in effecting mode conversion of other portions of the radio receiver by means of its energization of the secondary control bus 32. The secondary control bus is energized through the degenerative feedback network in the fourth stage of the IF amplifier. The complete circuit of the IF amplifier is shown in FIGS. 2A and 2B, while in FIG. 1, only those portions of the IF amplifier circuit which are necessary to explain the energization of the secondary control bus and the operation of the degenerative feedback network are shown. In particular, while each of the five stages of the IF amplifier (34, 35) are formed of emitter coupled transistor pairs, only circuitry of the fourth stage is illustrated in FIG. 1. The fourth stage comprises a pair of differentially coupled transistors Q7, Q8, the first transistor of which is in an emitter-follower configuration and the second of which is in the emitter input-bias-common configuration. The IF input signal to the fourth stage is applied to the base of the first transistor (Q7) of the pair and the collector of the first transistor is connected to the primary control bus 31 for collector bias energization. The output appearing at the emitter of the first transistor Q7 is coupled to the emitter of the second transistor (Q8). The collector of transistor Q8 is the point at which the output signal of the fourth stage appears. The collector of Q8 is connected to the primary control bus 31 through a collector load resistance R7 and through a degenerative feedback resistance R9 to the base of Q8. The base of the transistor Q8 is connected to the secondary control bus 32. The control bus 32 which is energized through resistances R7, R9 is coupled via pad 1 to a first filter capacitor 42. Capacitor 42 provides a first capacity between the control bus and ground, which is present in all mode settings and which produces a first frequency dependent modification of the degenerative feedback in the AM mode setting. The control bus 32 is coupled via the mode selection switch 30 to a second capacitor 43 connected to the third control bus 33. Capacitor 43 in parallel with capacitor 42 provides a second larger capacity acting between the secondary control bus and ground effective only in the AM mode setting. The paralleled capacity of 42 and 43 produces a second frequency dependent modification of the degenerative feedback in the FM mode setting.

The d.c. voltage on the secondary control bus 32 is dependent on the mode setting and on the level of the detected signal since it is dependent on the voltage on the primary control bus. It is also dependent on the magnitudes of the resistances R7 and R9. Upon conversion from the FM to the AM mode, the potential on the primary control bus 31 is reduced (2.5 to 1.5 volts) producing a slightly less than proportional reduction in the potential on the secondary control bus (1.8 to 1.2 volts). The voltage on the secondary control bus at the same time varies in approximate proportion to the changes in the voltage on the primary control bus which arise from signal dependent changes. In the FM mode, the voltage on the primary control bus varies from 2 to 3 volts as a result of signal de-tuning. In the AM mode, the voltage on the primary control bus varies from about 1.5 to 0.85 volts as a result of changes in signal level.

The secondary control bus 32, which reflects the potentials on the primary control bus, is usable for further mode switching and for automatic gain control. In the initial four stages of the IF amplifier, the bases of the transistors are returned to the secondary control bus while the emitters are returned to ground. Thus, variations in the potential on the secondary control bus attributable to variations in detector output produce emitter current changes in each of these four differential stages of the IF amplifier. Changes in the emitter current change the transistor transconductance and produce the desired automatic gain control action.

Since the source energizing the secondary control bus 32 is the relatively high impedance, low current fourth IF transistor stage, the loading on the secondary control bus should be small. In the illustrated circuit, the load current required for control purposes is less than 20 microamperes.

The d.c. gain attributable to the degenerative feedback network is invariant with the setting of the mode selection switch 30, but the a.c. gain, which produces significant noise reduction, is dependent on the mode setting. Resistors R7 and R9 in the degenerative feedback network are typically of the same value (IK each) and are selected to reduce the d.c. gain of the fourth stage of the IF amplifier to near unity. D.C. connections of the bases of prior transistors in the IF amplifier to the control bus 32 similarly reduce the d.c. gain of each of the first four stages to unity. The total d.c. gain of the four stages is thus near unity and substantially the same in either mode setting.

The a.c. gain reduction attributable to the degenerative network is dependent on the mode setting. In the FM mode setting, capacitor 42, in combination with other fixed circuit parameters of the IF amplifier 34, causes increasing degeneration below the FM IF frequency. The noise problem, which the degenerative network is designed to solve is encountered principally in FM reception. Here the interference tends to occur throughout the broadcast band spectrum from strong local signals and from signals converted to the AM IF frequency. Suppressing the low frequency response of the IF amplifier below 10 MHz reduces both sources of stray pick up and produces a general noise immunity. In AM reception, while the possibility of stray pick up is smaller, the circuit provides greater noise immunity.

Figure 4:
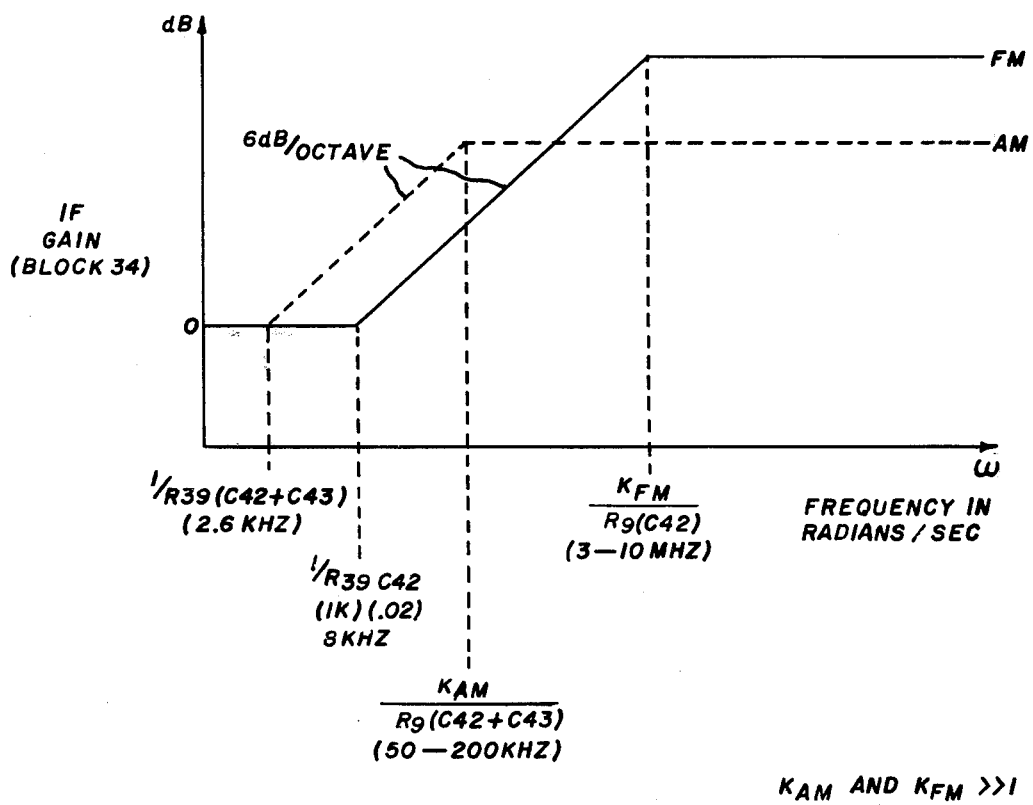
FIG. 4 is a graph of the frequency response of the intermediate frequency amplifier attributable to the degenerative feedback network and producing improved noise performance.

The degenerative feedback network provides the RC "doublet" action shown in the FM and AM frequency response curves of FIG. 4. The network produces a high pass condition above the higher frequency break, a band attenuation condition below the lower frequency break, and an intervening region having a 6 db octave slope. In the FM setting, the lower frequency break is inversely proportional to the product of the feedback resistance R9 (1000 ohms) and the capacity of capacitor 42 (0.02 microfarads). The higher frequency break is proportional to:

$$K_{FM}/R9 \ (C42) \qquad (1)$$

where $K_{FM}$ is the d.c. gain of the first four IF stages in the FM setting. The higher break is normally selected to be below the FM IF frequency, i.e., 3 to 10 megahertz, while the lower break is around 10 kilohertz.

In the AM mode, both capacitor 42 and capacitor 43 are paralleled. These two capacitances, in combination with other fixed circuit parameters lower the frequency of the upper break to below the AM IF frequency to restore the AM signal gain. The network introduces degeneration commencing at a point below the AM IF frequency. This causes further noise reduction as shown in FIG. 4.

The frequency of the higher break for AM operation is proportional to:

$$K_{AM}/R9 \ (C42 \ + \ C43) \qquad (2)$$

where $K_{AM}$ is the d.c. gain of the first four stages in the AM setting. The higher break is conveniently between 50 and 200 KHz, placing the lower break at about 3 kilohertz.

The last section (35) of the IF amplifier is coupled through the AM-FM filter 37 to the AM-FM detector 38. It consists of a fifth emitter coupled pair of transistors Q9, Q10. The circuit configuration is shown in FIG. 2. The bases of transistors Q9 and Q10 are coupled respectively to the upper and lower terminals of the degenerative feedback resistance R9. The emitter current of Q9, Q10 is supplied by the current source Q12. The collector of Q9 is connected to the 6 volt B+ bus on the chip, while the collector of Q10 is d.c. coupled via pad 15 through the AM-FM filter 37 to the 6 volt B+ bus. By virtue of the connection of the emitters of Q9, Q10 to the current source Q12, the transistors Q9, Q10 are not subject to AGC action as the voltage on the secondary control bus varies the base potentials. Thus, the last two stages Q9, Q10 operate in a high gain condition unreduced by any controls.

In the interest of maximizing the gain of the IF amplifier and of reducing imbalance current to a minimum, which tends to reduce gain, the areas of the transistor pair Q9, Q10 are unbalanced to take into account the differential in d.c. potentials applied to the bases of Q9 and Q10 as a result of current flowing in the feedback resistor R9. This voltage drop is typically a few tens of millivolts as compared to the diode drop of several hundred millivolts. Any imbalance in emitter current is readily corrected by making the area of transistor Q9, which has the higher forward bias, proportionally smaller than the area of the transistor Q10 to equalize the currents for zero signal conditions. (Degenerative feedback in the prior four stages of the IF amplifier maintains d.c. balance, thereby maximizing the stage gain in the prior stages.)

Signal detection and audio amplification following the IF amplifier 34, 35 and the AM-FM filter 37 takes place in the AM-FM detector 38; the FM audio block 39; AM audio block 40; and the audio power amplifier 44. A phono input connection 45 and a volume control 46 for controlling the AM-FM and phono inputs is also provided.

The detector and audio elements are interconnected in a conventional fashion. The output of the IF amplifier 34, 35 is coupled through the AM-FM filter 37 to the AM-FM detector 38. The AM-FM detector is provided with two output connections, one to the FM audio (39) and the other to the AM audio (40) block. When the AM-FM detector is in the FM mode, its output signal contains pulse width modulations reproducing the original frequency modulation. This signal is coupled to the FM audio block 39, which converts the variable width pulses into a conventional amplitude modulated waveform suitable for amplification in the audio power amplifier 44. When the AM-FM detector is in the AM mode of operation, it operates as a peak detector of the amplitude modulated signal. The AM audio block 39 preamplifies the detected output to a level suitable for driving the audio power amplifier 44.

The detected AM and FM signals and the phono inputs are combined at the volume control 46 for application to the audio power amplifier 44. The audio signal output of the FM audio block 39 and AM audio block 40 are coupled to the pad 8 and through the capacitor 47 to the first end terminal of the volume control 46. A noise filtering capacitor 48 by-passes pad 8 to ground. The phono input jack 45 is coupled through an impedance matching resistance 50 (whose magnitude depends on the impedance and output level of the phono cartridge to the same first end terminal of the volume control 46. The other end terminal of the volume control is grounded. The tap on the volume control is coupled through a 22K resistance 49 to the pad 9 leading to the input of the audio power amplifier 44. A capacitor 51 for high frequency roll off is coupled between pad 9 and ground. The configuration permits one to optionally drive the audio power amplifier 44 from either the output of the FM audio block, the AM audio block or the phono input. The audio output of the power amplifier drives the loudspeaker 52.

The remaining blocks in FIG. 1 pertain to the power supplies and to the application of power to the signal circuits for mode selection. The remaining blocks include the current amplifier 36 mentioned earlier, its associated controlled current source 54, the switched current sources 55, 56 and 57 associated respectively with the AM-FM detector 38, the FM audio 39 and the AM audio 40, and the 1.2 volt temperature compensated souce 53.

Taking up the power supplies, the primary source of energy for all of the radio receiver circuitry is the external 6 volt source 58 coupled to the double pads 13. This source may take the form of a battery or rectifier and filter operating from a 110 volt a.c. main. The lower segment of the pad 13 is used to provide power for the audio power amplifier 44, while the upper segment is used to energize the temperature compensated 1.2 volt source 53 and other portions of the radio receiver. A second uncompensated 1.2 volt source is developed within the audio power amplifier. The latter 1.2 volt source is used to provide a start up control for the temperature compensated source 53 and for mode conversion of the FM tuner. The latter 1.2 volt source is coupled to the pad 10, by-passed to ground by a large filter capacitor 59 and coupled to the stationary FM terminal of the mode selection switch 29.

Mode selection of the ratio receiver (FM tuner excepted) is controlled by the mode selection switch 30 action upon the current sources 54, 55, 56 and 57. The mode switching control bus 33, whose voltage is at zero in the FM setting of the mode selection switch 30 and at a small positive potential (0.8 to 1.2 volts) in the AM setting is coupled to the AM mixer, the AM oscillator (both earlier noted), the controlled current source 54 and all three switched current sources 55, 56 and 57. The output of the 1.2 volt temperature compensated source is coupled via a fourth bus 60 to the AM mixer, the controlled current source 54 and two switched current sources 55 and 56.

Mode selection of the AM mixer 23 and AM oscillator 24 is achieved by the circuitry shown in FIG. 2A. The AM mixer consists of a four quadrant multiplier consisting of two pairs of differently connected transistors (Q13, Q14, Q15, Q16) in an upper rank and a single pair of differentially connected transistors Q30, Q31 in a lower rank. The AM signal is applied to the bases of the lower rank transistors and the oscillator signal is applied to the bases of the upper rank transistors. The lower rank transistors act as a current source for establishing the amount of current available to the transistors in the upper rank. The d.c. current level in the lower rank transistors Q30, Q31 is in turn governed by the bias on their input junctions. The emitters of Q30, Q31 are returned to ground through a tapped resistance R16, R18, while the bases of Q30, Q31 are returned to the secondary control bus 33, which establishes bias on their input junctions. When the secondary control bus 32 is provided with a small positive potential as occurs in the AM setting of the selector switch 30, the input junctions of the lower rank transistors Q30, Q31 are biased on, making current available to the AM mixer and enabling the circuit to operate. In the FM setting of switch 30 the bases of the lower rank transistors Q30, Q31 are returned to ground. In this setting the lower rank transistor junctions have inadequate forward bias, turning off the current in the AM mixer and forcing the circuit into quiescence.

Mode selection of the AM oscillator is best understood by reference to FIG. 2A. The AM oscillator is comprised of a differentially connected pair of transistors Q32, Q34, whose emitter current is supplied by an additional transistor current source Q33. The emitter of the transistor current source Q33 is returned to ground through a low resistance and its base is connected to the secondary control bus 33. When the mode switch 30 is in the AM position, current source transistor Q33 is turned on, supplying current to the AM oscillator and permitting oscillation. In the FM setting of the switch 30, the base of the current source Q33 is grounded, removing the forward bias and turning it off. When Q33 is turned off, operation of the AM oscillator is precluded.

The mode selection of the IF amplifier is also dependent on the mode setting of switch 30, which affects the potential on the primary control bus 31. As earlier noted, when the potential on the primary control bus 31 is low for AM operation, the IF gain is lower and controllable in response to signal dependent voltage changes on the bus. When the potential on bus 31 is high for FM operation, the IF gain is high and signal dependent voltage changes on the bus are used for automatic frequency control of the FM tuner. The potential on bus 31 is controlled by the current amplifier 36, which is controlled by current source 54. The controlled current source 54 is further divided into two individual current sources, one (Q22, FIG. 2B,) of which is controlled in response to the average level of the audio signal appearing at the pad 8 and resulting from outputs of either the FM audio or AM audio blocks. The second individual current source (Q23, FIG. 2B) of 54 is controlled by the voltage difference existing between the 1.2 volt temperature compensated bus 60 and the mode switching control bus 33. In the AM setting of switch 30, which elevates the potential on bus 33 to slightly under the potential on bus 33 to slightly under the potential on bus 60, the Q23 current source is turned off as a result of a reduction in forward bias of the input junction. When Q23 is turned off, the current supplied to the current amplifier 36 is reduced and the voltage at the primary control bus 31 is reduced to about 1.5 volts required for gain controlled AM operation. In the FM mode setting of switch 30 the bus 33 is grounded, the forward bias on the input junction of Q23 is increased turning it on and increasing the current supplied to current amplifier 36. This elevates the voltage on the primary control bus 31 to 2.5 volts required for high gain FM operation of the IF amplifier.

The mode setting of the AM-FM detector 38 is also controlled by the switch 30, which controls the current supplied thereto. The AM-FM detector is designed to function in an FM detection mode in a high current condition when FM signals are supplied in reference phase and in quadrature phase. The output takes the form of a pulse width modulation reproducing the modulating signal. In the FM setting of the switch 30, the bus 33 is grounded, forward bias is provided to the input junction of Q25, turning it on strongly, and increasing the current available to the detector as required for proper FM detection. In the AM setting, the AM-FM detector is designed to function as a peak detector in a very low current condition. The amount of current available to the AM-FM detector is established by the switched current source 55 (transistor Q25, FIG. 2B), which is controlled by the voltage difference existing between the 1.2 volt temperature compensated bus 60 and the mode switching control bus 33. In the AM setting of the switch 30, which elevates the potential on bus 33 to slightly under the potential on bus 60, current source 55 is turned off. The only current available to the detector 38 is then a few microamperes of base current available from the following audio preamplifier 40. This permits operation of the AM-FM detector as an AM peak detector.

The mode setting of the FM audio block 39 is controlled in the same manner as the AM-FM detector by the switch 30. The FM audio block is provided with current from the switched current source 56 (transistor Q26, in FIG. 2B). That current source is controlled by the voltage difference existing between the 1.2 volt temperature compensated bus 60 and the mode switching control bus 33. In the AM setting of switch 30, which elevates the potential on bus 33 to slightly under the potential on bus 60, the switched current source 56 is turned off, disabling the FM audio block. In the FM setting of the switch 30, the bus 60 is grounded, the forward bias on the input junction of Q26 is increased, turning it on and supplying the current requisite for operation of the FM audio block.

The mode setting of the AM audio block 40 is controlled in a complementary manner to that of the FM audio block. The AM audio block is provided with current from the switched current source 57 (transistor Q29, FIG. 2B). The emitter of the (NPN) transistor Q26 is returned to ground while its base is coupled to the secondary control bus. In the FM mode setting, with the secondary control bus grounded, the transistor Q29 is turned off, preventing any supply of current to the AM audio block and disabling it. In the AM mode setting of the control switch 30, the base of Q29 is provided with a substantial forward bias, turning it on and in turn turning on the AM audio block 40.

In the AM-FM mode conversion may be summarized. In the FM mode, the FM turner (including mixer 21 and oscillator 22) is turned on or off by the selector switch 29. The condition of the other blocks are dependent on selector switch 30. The IF amplifier 34, 35 is switched to a high collector bias - high gain condition by setting selector switch 30 to the FM position. Switch 30 increases the current in the current source 54 which supplies more current to current amplifier 36. The AM-FM detector is set to a high current state by setting switch 30 to the FM position, which turns on current source 55. Finally, the AM audio block 40 is turned off by setting switch 30 to the FM position which turns off current source 56. In the AM mode, the FM tuner is turned off by the selector switch 29. The condition of the other blocks are again dependent on selector switch 30. In the AM position of selector switch 30, the AM mixer and AM oscillator 23, 24 are turned on, the current amplifier 36 is turned to a low current setting by the controlled current source 54; the AM-FM detector 38, the FM audio block 39 both have their respective current sources (55, 56) switched off; and the AM audio block 40 is turned on by its current source 57.

The foregoing AM-FM mode conversion is also consistent with a third, phono mode in which neither the AM nor FM portions of the radio receiver are in operation. As previously noted, a phono input is provided at the volume control 46 which controls the AM and FM outputs. Thus, all three sources may be coupled to the input of the audio power amplifier 44 where they may be used to drive the loudspeaker 52. The phono mode may be added without further alteration other than the addition of an intermediate position to the selector switches 29 and 30. The intermediate position should allow movable contactors to be isolated from both the AM and FM stationary contacts. This configuration is economically most advantages, since it permits the switches to be of a minimum cost. In the phono setting, the FM tuner is inoperative since there is no adequate bias, the AM mixer and AM oscillator are inoperative; the current sources 54, 55, 56 and 57 are all in a low current condition precluding operation of the AM-FM detector 38, the FM audio 39, the AM audio 40. Finally, since the current amplifier 36 is jointly responsive to the detected signal level (Q22) and switched current source (Q23), both controls reduce its current output and disable the IF amplifier. Thus, in this intermediate switch position neither the AM nor FM portions of the receiver contribute to the audio output. In the event that additional costs may be tolerated, the mode switches may each have an added stationary contact for the phono setting as shown in FIG. 4. In that form, the stationary phono contactor for switch 29 should be grounded, while the stationary phono contactor for switch 30 should be grounded through a resistance.

The major circuitry of a radio receiver embodying the present invention is depicted in FIGS. 2A and 2B. While reference has been made to several portions of that circuitry in the prior discussion, several other circuit portions are of interest in facilitating an understanding of the invention and the precise manner in which the block diagram of FIG. 1 is implemented.

The circuit of the FM tuner is optimized for easy mode switching and is readily subjected to automatic frequency control. The FM tuner consists of a serially energized mixer 21 and oscillator 22, both deriving current from the same point of connection to the primary control bus. The mixer 21 includes a tuned antenna circuit (shown generally at 74) coupled to the base of the mixer transistor TR1. The collector of TR1 is d.c. coupled to the primary control bus 31 through the inductor of the IF filter 27 and a 100 ohm resistance 71. The FM oscillator 22 includes a second tuned circuit 72 and a second transistor TR2. The emitter of the transistor TR1 is coupled through the d.c. path provided by the inductor of tuned circuit 72 to the collector of the oscillator transistor (TR2). The emitter of the oscillator transistor is coupled to ground through resistance 73. Thus, a series path is completed for current from the primary control bus 31 through the two transistors to ground. The base of the oscillator transistor (TR2) is coupled to the mode switch 29 which is grounded in the AM position. Grounding the base of TR2 removes its forward bias, cutting it off and precluding current through both the mixer and oscillator transistors of the FM tuner. When the selector switch 29 is set to the FM position, the base of oscillator transistor TR2 has a positive potential, forward biasing the input of the junction of the transistor and permitting current to flow both through TR2 and the mixer transistor TR1 and activating the tuner.

Automatic control of the FM tuner is also readily achieved. It is well known that the frequency of a transistor oscillator may be modulated by adjustment of its collector-base potential. The AFC circuit is arranged to operate on this principle in response to changes in potential on the primary control bus 31. The base of the FM mixer transistor (TR1) is d.c. coupled to the primary control bus through resistance 71. By virtue of the previously noted d.c. connection between the emitter of TR1 and the collector of TR1, any changes in potential on the control bus are transferred through the input junction of TR1 and the collector of TR2. Thus, the voltage on the primary control bus less the drop across the input junction of TR1 is applied to the collector of TR2. Since the voltage on the control bus varies as a function of the frequency offset of the detected FM signal, it may be used to correct the oscillator frequency automatically to achieve optimum tuning pursuant to the automatic frequency control function.

The circuit of the current amplifier 36, controlled current source 54, and the 1.2 volt temperature compensated source 53 are illustrated in detail in FIG. 2B. Their function is to stabilize the gain of the IF amplifier and the tuning of the automatic frequency control network as against ambient or self-induced temperature changes. Without such a provision, the voltage on the primary control bus may vary 200 or 300 millivolts when a substantial temperature variation takes place. Thus, both gain and tuning can be noticably affected by such temperature variations. In the event that the FM tuner is in a high temperature condition when turned off, without such compensation it may not re-lock onto the prior station or it may lock onto a different station altogether when turned back on in a cold condition.

The foregoing and several other temperature problems are avoided by the use of temperature compensated 1.2 volt source 53. The current amplifier 36 and controlled current source 54 consist of diode connected transistor Q11 and Q17. Q22, Q23. Q17 is a laterally formed PNP transistor whose emitter is returned to the 6 volt B+ bus and whose collector is coupled to the primary control bus for energizing the bus. A small latching current is provided to the same bus by a transistor Q51 for insuring start up of the current amplifier. The base of current amplifier transistor Q17 is coupled to the collector of control transistor Q22. The base of Q22 is coupled to the pad 8 at which both the AM and FM outputs appear. By these connections, transistors Q22 effect a control on transistor Q17 proportional to the average level of the detected signal. The second control transistor (Q23) has its collector coupled to the base of current amplifer transistor Q17. Q23, as previously noted, is arranged to be switched on or off as a function of the mode setting of the radio receiver. The emitter of Q23 is returned through its emitter load resistance to the third control bus 33 where it assumes either a ground potential or the potential of the secondary control bus, dependent on the setting of selector switch 30. The base of Q23 is connected to the temperature compensated 1.2 volt output supply 53. The supply 53 is a band gap regulator in which Q61, D8, R56, R57 and R58 are the controlling components. Their parameters are selected to produce an output voltage with a zero temperature coefficient. The temperature compensated supply is energized through a connection to the B+ (6 volt) supply. A connection is also provided to the amplifier for deriving a 1.2 volt start-up potential for this supply. In the FM mode, the recited connections to the temperature stabilized voltage supply provide a very accurate control over transistors Q23, Q17. Thus by stabilizing the potential on the primary control bus 31, both IF gain and oscillator frequency are stabilized for FM operation. Also in the FM mode of operation, the temperature compensated supply 53 is used to stabilize the current levels in the AM-FM detector (Q18, Q19) and the FM audio block (Q24, Q27) to stabilize the resultant audio output.

In the AM mode, the temperature compensated supply 53 provides a convenient on-the-chip-source of voltage for effecting a delay in the AGC action on the AM mixer. The mixer AGC circuit is best understood by reference to FIG. 2A. The AGC delay circuitry produces an initially slow rate of gain withdrawal from AM mixer 23 until a given point is reached and then the rate of gain withdrawal is increased. The delay circuitry comprises resistances R16, R17, R18 and transistor Q35. Resistances R18 and R16 are serially coupled between ground and the emitters of the lower rank transistors Q30, Q31 of the AM mixer. Transistor Q35 has its base coupled via bus 60 to the 1.2 volt temperature compensated source 53 and its collector coupled to the 6 volt B+ bus. Its emitter is coupled through resistance R17 to the connection point between R16 and R18. The transistor Q35 may be regarded as a voltage reference equal to 1.2 volts less the Vbe drop of the transistor.

The AGC characteristic of the mixer circuitry may be explained using Thevenin's theorem. The lower rank mixer transistors (Q30, Q31) may be regarded as having an emitter load consisting of a virtual reistance R16' in series with a virtual voltage $V_1$. R16' is defined to be:

$$R\ 16' = R16 + R17\ R18\ /(R17 + R18) \qquad (3)$$

and $V_1$ is defined to be:

$$V_1 = 0.5V \, R18/(R18 + R17) \tag{4}$$

where 0.5 volts represents the (1.2 volt $-$ $Vbe$) at transistor Q35.

These produce the double slop AGC characteristic mentioned above. For low input signal levels, the AGC bus voltage will be maximum, initially about 1.2 volts. The mixer current will be determined primarily by R16' and the voltage difference (initially about 0.3 V) between the emitter and $V_1$. As the signal increases, the AGC bus voltage drops to the point where the degenerative effect of R16' is no longer significant. At this point, the gain is then determined primarily by the base emitter log characteristic of the lower rank transistors Q30, Q31. In this high signal region, the $g_m$ and accordingly the gain of the mixer reduces at a faster rate with increasing signal than when the degenerative effect was predominant. The foregoing double slope is potentially present in the IF amplifier. However, because of the pre-bias attributable to $V_1$, the "knee" of the AGC characteristic (the point at which maximum slope starts) occurs in the mixer at a 200 millivolt higher AGC bus potential than it would occur in the IF. When the AGC control range is properly limited, the IF amplifier does not go beyond the "degenerative" region or enter the "knee" AGC characteristic. Since at high signal levels the gain is reduced faster in the mixer than in the IF amplifer, one may regard the gain reduction in the mixer as being with respect to the IF amplifer.

The mixer AGC action also entails a property of the four quadrant multiplier configuration. As seen in FIG. 2A, the AM oscillator 24 is also subjected to AGC action. Thus, when strong signals are present, a reduction in local oscillator injection takes place, bringing about a proportionate reduction in conversion gain and producing further extension in the AGC control range.

The foregoing mixer configuration is particularly advantageous in that the AM mixer can handle very large overload signals with low (less than 10%) total harmonic distortion. This arises because at very high overload signals, the mixer becomes self-biased from rectification of the input signal in the base emitter junction of transistor Q30. If IF output filters for the mixer remove the unwanted harmonics, and the eventual de-modulated audio signal is relatively undistorted.

What we claim as new and desire to secure by Letters Patent of the United States is:

1. In a radio receiver having AM and FM modes, the combination comprising:
   A. a d.c. coupled IF amplifier for signals at two intermediate frequencies, subject to amplification control by bias voltage variation and including a plurality of stages having wide band a.c. gain embracing both of said frequencies, each stage including an emitter coupled transistor pair,
   b. means comprising a primary control bus for applying a d.c. collector bias to the individual IF amplifier transistors, said potential being subject to variation in accordance with the mode setting of the radio receiver and/or a signal parameter,
   c. a secondary control bus for controlling the input bias level of the individual IF amplifier transistors and for applying a degenerative feedback to balance each transistor pair,
   d. means for establishing said secondary control bus at a potential which is a function of the potential of said primary control bus and for applying degenerative d. c. feedback to said secondary control bus, including
      1. a collector load resistance connected between said primary control bus and the collector of the final transistor of one IF amplifier stage, and
      2. a degenerative feedback resistance having one end connected to said collector and the other end to the base of said final transistor and to said secondary control bus, and
   e. capacitance means for bypassing said secondary control bus to ground having a first value in the FM mode, selected in respect to the feedback resistance and the FM gain of said IF amplifier to preclude degenerative feedback at the higher FM IF frequency and to provide a decreased gain and attenuation of noise below said higher IF frequency, and a second value in the AM mode selected in respect to said feedback resistance and the AM gain of said IF amplifier to preclude degenerative feedback at the lower AM IF frequency.

2. The combination set forth in claim 1 wherein an AM-FM Detector is provided, and wherein a final IF amplifier stage is provided comprising an emitter coupled transistor pair whose output is coupled to the input of said AM-FM detector, and whose base electrodes are connected to the respective ends of said feedback resistor for signal input, the areas of the transistors of said final transistor pair being proportional to maintain equal emitter currents in the presence of the small d.c. potential existing across said feedback resistor.

3. The combination set forth in claim 1 wherein said capacitance means comprises:
   a. first capacitor having said first value, and
   b. a second capacitor switched into parallel with said first capacitor in the AM mode to provide said second value.

4. The combination set forth in claim 3 having in addition thereto: mode switching means for converting to AM or FM operation comprising:
   1. a first switch having
      i. a first stationary contact coupled to said secondary control bus,
      ii. a second stationary contact coupled to ground, and
      iii. a movable contactor selectively contacting said stationary contacts for mode selection, and
   2. a third control bus coupled to said movable contactor and assuming ground potential for FM operation and the potential of said secondary control bus for AM operation, to provide a variation in bus potential sufficient to render transistors whose input junctions are coupled thereto conductive or non-conductive.

5. The combination set forth in claim 4 having in addition thereto: a tuner for converting received AM and FM signals to said two predetermined intermediate frequencies, comprising:
   1. an FM portion connected to said primary control bus and including a local oscillator, tunable by bias voltage adjustment and energized through said connection, and
   2. an AM portion to said third control bus for automatic gain control.

6. The combination set forth in claim 5 wherein said moe switching means is connected to said tuner for conversion to AM or FM operation.

7. The combination set forth in claim 6 wherein the AM portion includes:

a. a four quadrant multiplier mixer comprising two pairs of differentially connected transistors in an upper rank and a single pair of differentially connected transistors in a lower rank, said AM signal being injected into said lower rank, and b. an AM oscillator having a transistor current source for amplitude control, the output of said oscillator being injected into said upper rank; and wherein the input junctions of said lower rank mixer transistors and said oscillator current source are coupled to said third control bus for turning on said AM tuner and for automatic gain control in the AM position of said first switch and for turning off said AM turner in the FM position of said first switch.

8. The combination set forth in claim 7 wherein the bases of said lower rank AM detector transistors and of said oscillator transistor current source are coupled to said third control bus while the emitters thereof are resistively coupled to ground, whereby said AM mixer and AM oscillator are turned on in the AM position of said first switch and are turned off in the FM position.

9. The combination set forth in claim 8 wherein:
a. said FM local oscillator is a transistor oscillator and wherein
b. said mode switching means includes a second switch ganged with said first switch having
   1. a first stationary contact connected to ground for the AM mode,
   2. a second stationary contact coupled to a source of positive d.c. potentials fo the FM mode, and
   3. a movable contactor selectively connecting said stationary contacts to provide a variation in potential sufficient to render transistors whose input junctions are coupled thereto conductive or nonconductive, and wherein
   4. the input junction of said FM oscillator transistor is coupled to said movable contactor for mode selection.

10. The combination set forth in claim 9 having in addition thereto:
a. an AM-FM detector for said amplified IF signals for producing a d.c. voltage for automatic frequency control proportional to the frequency offset when an FM signal is detected and for producing a d.c. voltage for automatic gain control proportional to amplitude when an AM signal is detected, and
b. bias supply means comprising:
   1. a current amplifier for deriving energy from a primary source of d.c. bias potentials and energizing said primary control bus,
   2. means coupled to said current amplifier for controlling the potential of said primary control base, said control means having:
      i. a first control responsive to the potential on said third control bus for setting the average bus potential in accordance with the mode selection, and
      ii. a second control responsive to said detector output for controlling said bus potential about said average bus potential as a function of detector output.

11. The combination set forth in claim 10 wherein: said primary control bus is set at a higher d.c. potential for FM operation increasing the gain of the IF amplifier and making the gain less sensitive to potential variation on said bus and set at a lower d.c. potential for AM operation making the gain of the IF amplifier more sensitive to potential variations on said bus such as those resulting from variations in detector output.

12. The combination set forth in claim 11 having in addition thereto:
a. an AM audio stage and an FM audio stage are provided coupled to the ouput of said AM-FM detector, and wherein
b. said bias supply means further comprises a temperature compensated input bias source having a potential less than the sum of the secondary control bus potential and the potential at which the controlled input junctions turn on, to insure inactivation, and wherein
c. said mode switching means includes four transistor current sources for supplying current respectively to said current amplifier, said AM-FM detector, said FM audio stage, and said AM audio stage, said first three transistor current sources having a first like input electrode returned to said third control bus and the other input electrode coupled to said temperature compensated bias source, and said fourth transistor current source having one input electrode connected to said third control bus and the other grounded,
   whereby said first three transistor current sources are turned on while said fourth current stage is turned off in the FM position of said first switch, and said first three transistor current sources are turned off and said fourth transistor current source is turned on in the AM position.

13. The combination set forth in claim 12 having in addition thereto:
a. a tapped resistance connected between the emitter of said lower rank transistors and ground,
b. a transistor in emitter follower configuration having its collector coupled to a source of d.c. bias potentials, its base coupled to said temperature compensated source and its emitter coupled through a resistive path to said tap,
   said configuration providing an automatic gain control characteristic in which as gain withdrawal increases, the slope is initially gradual followed after a delay by a stepper region.

14. The combination set forth in claim 13 having in addition thereto:
   1. a separate phono input and an audio power amplifier energized from said primary bias source, and responsive to either end output of said AM audio, FM audio or said phono inputs; and wherein:
   2. said switching means is operable to a third position in which said movable contactors of said two switches contact neither said first now said second stationary contact to disable said AM mixer, said AM oscillator, said FM oscillator, said current amplifier, said AM-FM detector, said FM audio stage, said AM audio stage and thereby preclude AM or FM signals from interfering with said phono input at said power amplifier input.

15. The combination set forth in claim 14 wherein:
a stationary phono contact is provided in a third position on both said switches, said phono contact on said first switch being returned to ground through a resistance and said phono contact on said second switch being grounded.

16. In a radio receiver having AM and FM modes, the combination comprising:

a. a d.c. coupled IF amplifier for signals at two intermediate frequencies, subject to amplification control by bias voltage variation and including a plurality of stages having wide band a.c. gain embracing both of said frequencies, each stage including an emitter coupled transistor pair, b. means comprising a primary control bus for applying a d.c. collector bias to the individual IF amplifier transistors, said potential being subject to variation in accordance with the mode setting of the radio receiver and/or a signal parameter, c. a secondary control bus for controlling the input bias level of the individual IF amplifier transistors and for applying a degenerative feedback to balance each transistor pair, d. means for establishing said secondary control bus at a potential which is a function of the potential of said primary control bus and for applying degenerative d.c. feedback to said secondary control bus, including
1. a collector load resistance connected between said primary control bus and the collector of the final transistor of one IF amplifier stage, and
2. a degenerative feedback resistance having one end connected to said collector and the other end to the base of said final transistor and to said secondary control bus, and e. mode switching means for conversion to AM or FM operation comprising a third control bus adapted to assume ground potential for FM operation and the potential of said secondary control bus for AM operation to provide a variation in bus potential sufficient to render transistors whose input junctions are coupled thereto conductive or non-conductive, f. a tuner for converting received AM signals to the lower of said two predetermined intermediate frequencies, including
1. a four quadrant multiplier mixer comprising two pairs of differentially connected transistors in an upper rank and single pair of differentially connected transistors in a lower rank, said AM signal being injected into said lower rank,
2. an AM oscillator having a transistor current source for amplitude control, the output of said oscillator being injected into said upper rank;
the input junction of said lower rank mixer transistors and said oscillator current source being coupled to said third control base for turning on said AM tuner and for automatic gain control in AM operation and for turning off said AM tuner in FM operation.

17. The combination set forth in claim 16 wherein the bases of said lower rank AM detector transistors and said oscillator transistor current source are coupled to said third control bus while the emitters thereof are resistively coupled to ground, whereby said AM mixer and AM oscillator are turned on in AM operation and are turned off in FM operation.

18. The combination set forth in claim 17 having in addition thereto:
a. an AM-FM detector for said amplified IF signals for producing a d.c. voltage for automatic frequency control proportional to the frequency offset when an FM signal is detected and for producing a d.c. voltage for automatic gain control proportional to amplitude when an AM signal is detected, and
b. bias supply means comprising:
1. a current amplifier for deriving energy from a primary source of d.c. bias potentials and energizing said primary control bus,
2. means coupled to said current amplifier for controlling the potential of said primary control bus, said control means having:
i. a first control responsive to the potential on said third control bus for setting the average bus potential in accordance with the mode selection, and
ii. a second control responsive to said detector output for controlling said bus potential about said average bus potential as a function of detector output.

19. The combination set forth in claim 17 wherein:
said primary control bus is set at a higher d.c. potential for FM operation increasing the gain of the IF amplifier and making the gain less sensitive to potential variation on said bus and set at a lower d.c. potential for AM operation making the gain of the IF amplifier more sensitive to potential variations on said bus such as those resulting from variations in detector ouput.

20. The combination set forth in claim 19 having in addition thereto:
a. an AM audio stage and an FM audio stage coupled to the ouput of said AM-FM detector, and wherein
b. said bias supply means further comprises a temperature compensated input bias source having a potential less than the sum of the secondary control bus potential and the potential at which the controlled input junctions turn on, to insure inactivation, and wherein
c. said mode switching means include four transistor current sources for supplying current respectively to said current amplifier, said AM-FM detector, said FM audio stage, and said AM audio stage, said first three transistor current sources having a first like input electrode returned to said third control bus and the other input electrode coupled to said temperature compensated bias source, and said fourth transistor current source having one input electrode connected to said third control bus and the other ground,
whereby said first three transistor current sources are turned on while said fourth current source is turned off in FM operation, and said first three transistor current sources are turned off and said fourth transistor current source is turned on in FM operation.

* * * * *